(12) United States Patent
Kuo

(10) Patent No.: US 6,957,995 B2
(45) Date of Patent: Oct. 25, 2005

(54) APPARATUS FOR REPAIRING ORGANIC ELECTROLUMINESCENT ELEMENT DEFECTS

(75) Inventor: Chih-Ming Kuo, Sanchung (TW)

(73) Assignee: Ritdisplay Corporation, Hsin Chu (TW)

( * ) Notice: Subject to any disclaimer, the term of this patent is extended or adjusted under 35 U.S.C. 154(b) by 310 days.

(21) Appl. No.: 10/602,655

(22) Filed: Jun. 25, 2003

(65) Prior Publication Data

US 2004/0002277 A1 Jan. 1, 2004

(30) Foreign Application Priority Data

Jun. 28, 2002 (TW) ................................ 91114444 A

(51) Int. Cl.7 .......................... H01J 9/50; H01L 21/00

(52) U.S. Cl. ........................................ 445/61; 438/4

(58) Field of Search ...................... 445/61, 2; 438/22, 438/4

(56) References Cited

U.S. PATENT DOCUMENTS

2002/0042152 A1 * 4/2002 Yamazaki et al. ............ 438/4

* cited by examiner

Primary Examiner—Joseph Williams
(74) Attorney, Agent, or Firm—Birch, Stewart, Kolasch & Birch, LLP

(57) ABSTRACT

An apparatus for repairing organic electroluminescent element defects is used to repair the electroluminescent element having a substantial short circuit portion/substantial short portions. The apparatus includes a transfer chamber, an electrical testing chamber and an insulator-forming chamber. In this case, the organic electroluminescent element is transferred in the transfer chamber. In the electrical testing chamber, a power supply source is provided to apply a current or voltage to the organic electroluminescent element, so that the short circuit portion or portions of the organic electroluminescent element is turned to an open circuit portion or open circuit portions. In the insulator-forming chamber, an insulator is formed on the open circuit portion or portions of the organic electroluminescent element. The invention also discloses an apparatus for repairing organic electroluminescent element defects, which further includes an optoelectrical detecting chamber.

20 Claims, 2 Drawing Sheets

APPARATUS FOR REPAIRING ORGANIC ELECTROLUMINESCENT ELEMENT DEFECTS

BACKGROUND OF THE INVENTION

1. Field of the Invention

The invention relates to an apparatus for repairing organic electroluminescent element defects, and more particularly to an apparatus for repairing organic electroluminescent element defects, which is capable of repairing substantial short circuit portions.

2. Description of the Related Art

In the manufacturing of organic electroluminescent element and organic electroluminescent display, a photolithography process is necessary to define an anode and an auxiliary anode, and then a process for forming organic and inorganic materials in a vacuum chamber is performed. Herein, the inorganic material includes the material of a cathode layer. Since the organic electroluminescent element is sensitive to environmental factors such as moisture and oxygen, which may influence the lifetime of the element, the organic electroluminescent element has to be encapsulated so as to keep the element under normal operations.

During the manufacturing processes of the organic electroluminescent element, if the cleanness of the clean room is insufficient, impurities such as bubbles or particles may exist in the organic electroluminescent element to cause substantial short circuit. Similarly, because the surface of an anode substrate within the organic electroluminescent element is rough and the structure of the organic electroluminescent element is weak, it is also possible to cause the substantial short circuit. Herein, electric current may only pass through defects of the electroluminescent element, which cause the substantial short circuit, and not all of pixels can be driven. Furthermore, the emitting efficiency of the element and the image display effects are influenced. If an apparatus for repairing organic electroluminescent element defects can be used to form a new structure to improve the poor properties of the original structure and to increase the product yield and reliability, the mass-production technology may be advantageously enhanced and the manufacturing cost may be greatly reduced.

Referring to FIG. 1, a conventional apparatus 3 for detecting organic electroluminescent element defects includes a transfer chamber 31 and an electrical testing chamber 32. Before performing electrical testing, the organic electroluminescent element is encapsulated. During the encapsulating process, a cover-cap is placed on and adhered to the element with a UV-cured adhesive, and the UV-cured adhesive is then cured. After the organic electroluminescent element is encapsulated, a cutting machine is used to cut the organic electroluminescent elements into small area. Then, a robot arm 311 in the transfer chamber 31 transfers each manufacture to the electrical testing chamber 32 for electrical tests. After testing, the manufacture with short circuit portions is picked out. Since all manufactures have been encapsulated, defects in the individual pixels inside the manufacture cannot be repaired. That is, the encapsulated manufacture cannot be re-worked. Thus, the entire manufacture has to be eliminated when short circuit portions are found. Accordingly, the product yield and reliability are decreased and the manufacturing cost is further increased.

SUMMARY OF THE INVENTION

It is therefore an object of the invention to provide an apparatus for repairing organic electroluminescent element defects, which is capable of repairing pixel defects, reducing manufacturing cost, and increasing product yield and reliability.

To achieve the above-mentioned object, the invention provides an apparatus for repairing organic electroluminescent element defects. The organic electroluminescent element has a substantial short circuit portion or substantial short circuit portions. The apparatus includes a transfer chamber, an electrical testing chamber, and an insulator-forming chamber. In the transfer chamber, the organic electroluminescent element is transferred. The electrical testing chamber is equipped with a power supply source, which applies a current or voltage to the organic electroluminescent element. Thus, the substantial short circuit portion or portions of the organic electroluminescent element turn to an open circuit portion or open circuit portions. In the insulator-forming chamber, an insulator is formed on the open circuit portion or portions of the organic electroluminescent element. The invention also provides an apparatus for repairing organic electroluminescent element defects. In this aspect, the apparatus further includes an optoelectrical detecting chamber. In the optoelectrical detecting chamber, the intensity, uniformity and color purity of brightness of the organic electroluminescent element and a short-circuited level of the organic electroluminescent element tested in the electrical testing chamber are detected. When a detected ratio of the short circuit portion or portions to the open circuit portion or portions is smaller than a predetermined value, or when a detected leakage current is smaller than a predetermined level, an insulator is formed on the open circuit portion or portions in the subsequent insulator-forming chamber.

The invention provides an apparatus for repairing organic electroluminescent element defects, which is capable of repairing pixel defects in an organic electroluminescent element before the package process is performed. The repairing method is to make the defective portions lose their electroconductivity, and to make pixels with defects have the same light-emitting abilities as those of its adjacent pixels without defects. The invention may repair the organic electroluminescent element having defective portions without eliminating the whole panel, thereby decreasing the manufacturing cost of the product and increasing the product yield and reliability.

BRIEF DESCRIPTION OF THE DRAWINGS

The invention will become more fully understood from the detailed description given in the herein below illustration only, and thus are not limitative of the invention, and wherein.

DETAILED DESCRIPTION OF THE INVENTION

The apparatuses of repairing organic electroluminescent element defects according to embodiments of the invention will be described with reference to the accompanying drawings.

Figure 1:
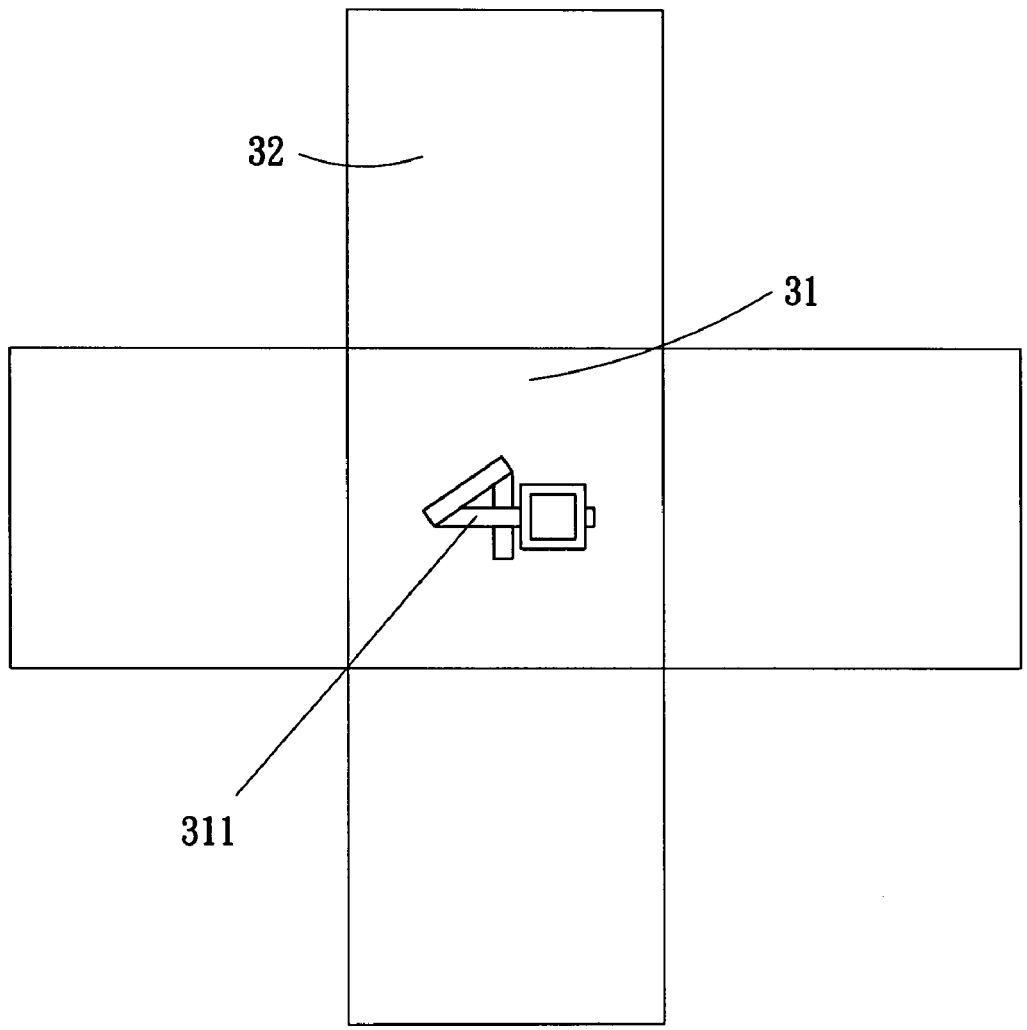
FIG. 1 is a schematic illustration showing a conventional apparatus for detecting organic electroluminescent element defects.
Figure 2:
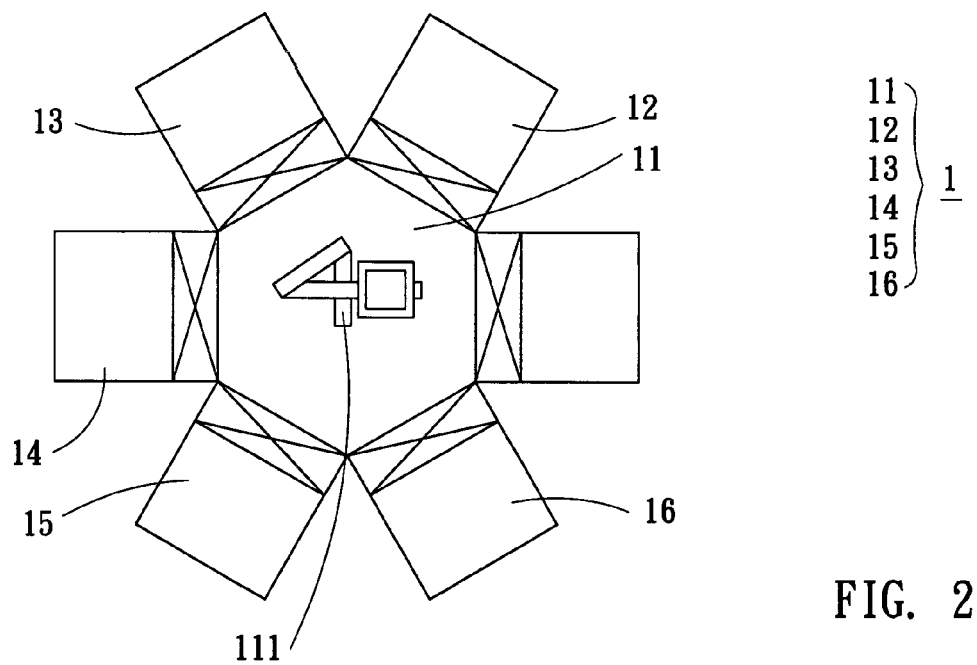
FIG. 2 is a schematic illustration showing an apparatus for repairing organic electroluminescent element defects according to a first embodiment of the invention.

Referring to FIG. 2, the invention provides an apparatus 1 of repairing organic electroluminescent element defects, which is used to repair an organic electroluminescent element having a substantial short circuit portion or substantial short circuit portions. The organic electroluminescent element includes a substrate, an anode, an organic functional layer and a cathode. The apparatus 1 includes a transfer chamber 11, an electrical testing chamber 12 and an insulator-forming chamber 13.

The organic electroluminescent element is transferred in the transfer chamber 11. The electrical testing chamber 12 is equipped with a power supply source (not shown), which applies a current or voltage to the anode substrate and the cathode of the organic electroluminescent element, so that the substantial short circuit portion or portions of the organic electroluminescent element can be turned to an open circuit portion or open circuit portions. In the insulator-forming chamber 13, an insulator is formed on the open circuit portion of the organic electroluminescent element.

The transfer chamber 11 of this embodiment has a polygon structure (hexagonal structure in FIG. 2), and is equipped with a robot arm 111. During the repairing process for the defects of the organic electroluminescent element, the robot arm 111 sequentially transfers the organic electroluminescent element to the electrical testing chamber 12 or the insulator-forming chamber 13, in which an electrical testing step or an insulator-forming step may be performed.

Since the material of the organic electroluminescent element is very sensitive to the moisture and tends to become dark spots after contacting with the atmosphere, the transfer chamber 11 has a venting system so that the subsequent processes may be performed in the vacuum state and the dark spots may be decreased accordingly. The venting system (not shown) of the transfer chamber 11 may be composed of an oil rotary pump, a mechanical pump, a turbo molecular pump, or a cryogenic pump, such that the transfer chamber 11 may be vacuumed in a short time with the venting system.

In order to decrease the formation of dark spots in the organic electroluminescent element, an inert gas (such as nitrogen and the like) may be filled into the transfer chamber 11 such that the subsequent processes may be performed at the inert atmosphere.

First, the robot arm 111 transfers the organic electroluminescent element to the electrical testing chamber 12. In this embodiment, the electrical testing chamber 12 is equipped with the power supply source, which applies a current or voltage to the anode and the cathode of the organic electroluminescent element. In more details, the power supply source respectively applies a positive voltage and a negative voltage to the anode and the cathode, so that the substantial short circuit portion or portions of the organic electroluminescent element can be turned to an open circuit portion or open circuit portions. Similarly, a negative voltage and a positive voltage may be applied to the anode and the cathode, respectively.

The electrical testing chamber is a buffer chamber or a single chamber, which may be vacuumed or filled with an inert atmosphere.

In the organic electroluminescent element, the substantial open circuit portion or portions may cause leakage current, power consumption and poor pixels. In such a case, the substantial short circuit portion means the portion is really short-circuited or approximately short-circuited. There are two conditions that cause the organic electroluminescent element having the substantial short circuit portion or portions. As for the first condition, no matter how critical the cleanness of the clean room environment is controlled in the processes for manufacturing the organic electroluminescent element, there are always few impurities, such as bubbles or particles, which may exist in the organic electroluminescent element. The impurities may cause the cathode to contact or substantially contact the anode when the cathode is formed, thereby causing the substantial short circuit portion or portions in the organic electroluminescent element. As for the second condition, when the surface roughness of the anode is too great or, for example, tips are formed on the surface of the anode, it is also possible to cause the substantial short circuit portion or portions.

In the electrical testing chamber, when a constant voltage and a variable current are applied, the panel having defects consumes higher current than normal current if the positive voltage is applied. In contrary, the panel produces higher leakage current if the negative voltage is applied. When a positive, constant current and a variable voltage are applied, the brightness of the panel is smaller or un-uniform. If the testing is cooperated with a photodiode to transform the brightness into a voltage value or an image, the error will be increased.

Next, the robot arm 111 transfers the organic electroluminescent element, which has the open circuit portion or portions, to the insulator-forming chamber 13. Then, an insulator is formed on the open circuit portion of the organic electroluminescent element by way of any proper film-forming process, for example a vacuum coating process. Since gas explosion may occur at the short circuit portion or portions caused by the impurities contained therein in the electrical testing chamber 12, the organic functional layer and the cathode of the organic electroluminescent element are outwardly curved. Alternatively, since the tips of the anode surface are melted by heating, the organic electroluminescent layer and the cathode are also curved. In the manufacturing steps for the organic electroluminescent element, the film-formed surface of the substrate often faces downwards. Thus, if an insulator is not immediately formed on the open circuit portions, as long as the film-formed surface of the substrate is turned upwards by any chance in the subsequent manufacturing steps, the curved cathode may contact the anode to form the short-circuited structure again.

Herein, the insulator may be made of the organic material such as that of the organic functional layer. For example, the organic material may be the material of a hole injection layer, a hole transporting layer, an electroluminescent layer, an electron transporting layer or an electron injection layer of the organic functional layer. Alternatively, the insulator may be formed of the inorganic material, such as silicon nitride, silicon oxide or silicon oxy-nitride. In addition, when the manufacturing processes are performed in connection with a passivation forming system, a polymer such as fluorocarbon resin and Parylene having a high resistance may be used as the material of the insulator. Furthermore, the insulator also may be formed by way of oxidizing the cathode in the atmosphere, which contains oxygen and is moisture-free, such as a metal oxide.

The apparatus 1 further includes a light-cured adhesive dispensing chamber 14, in which a light-cured adhesive is dispensed on the substrate of the organic electroluminescent element having the insulator according to a predetermined pattern. The light-cured adhesive may be an UV-cured adhesive, which may be cured upon the exposure of ultraviolet light. In addition, it is to be noted that moisture and bubbles have to be removed from the light-cured adhesive.

Next, the apparatus 1 further includes an encapsulation chamber 15, in which a cover-cap is placed on the substrate dispensed with the light-cured adhesive. A desiccant is provided in the cover-cap to remove moisture within the encapsulated organic electroluminescent element and to increase the lifetime of the element.

Furthermore, the apparatus 1 further includes a light-exposure chamber 16, in which the light-cured adhesive is exposed with the ultra-violet light. The light-cured adhesive is cured and then the cover-cap is encapsulated.

Figure 3:
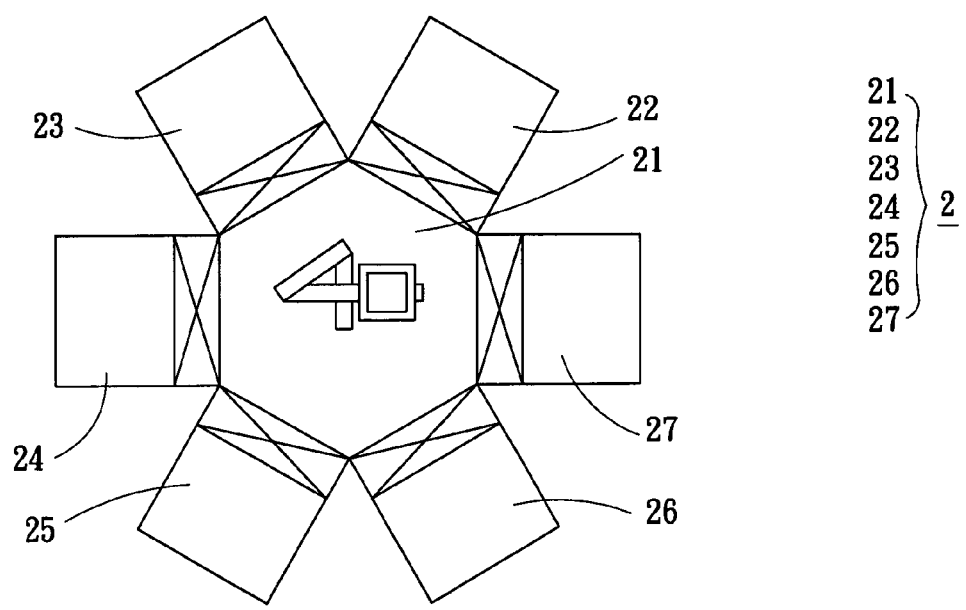
FIG. 3 is a schematic illustration showing an apparatus for repairing organic electroluminescent element defects according to a second embodiment of the invention.

As shown in FIG. 3, an apparatus 2 for repairing organic electroluminescent element defects according to a second embodiment of the invention is used to repair a substantial short circuit portion of the organic electroluminescent element. The organic electroluminescent element includes a substrate, an anode, an organic functional layer and a cathode. The apparatus for repairing organic electroluminescent element defects includes a transfer chamber 21, an electrical testing chamber 22, an optoelectrical detecting chamber 23 and an insulator-forming chamber 24.

The difference between this embodiment and the first embodiment resides in that a short-circuited level of the organic electroluminescent element which is tested in the electrical testing chamber 22 is detected in the optoelectrical detecting chamber 23. Herein, the short-circuited level means a ratio of the short circuit portions to the open circuit portions, or a level of leakage current. When the ratio of the short circuit portions to the open circuit portions, which is detected in the optoelectrical detecting chamber 23, is smaller than a predetermined value or the level of the leakage current is smaller than a predetermined level, an insulator is formed on the open circuit portions in the insulator-forming chamber 24.

In the optoelectrical detecting chamber 23, when the short-circuited level of the organic electroluminescent element is greater than the predetermined level (i.e., when the error result obtained by detecting the average leakage current or the brightness is greater than an acceptable value), an insulator will not be formed on the open circuit portions of the organic electroluminescent element in the insulator-forming chamber 24. On the other hand, when the short-circuited level of the organic electroluminescent element is smaller than a predetermined level, an insulator will be formed on the open circuit portions of the organic electroluminescent element in the insulator-forming chamber 24. When the short-circuited level of the organic electroluminescent element is greater than an acceptable range, and the organic electroluminescent element is not worth to be repaired, a detecting step performed in the optoelectrical detecting chamber 23 can reduce the loss of the insulator material, and the insulator only needs to be formed on the organic electroluminescent element that needs to be repaired.

The apparatus of this embodiment further includes a light-cured adhesive dispensing chamber 25, an encapsulation chamber 26, and a light-exposure chamber 27. The elements and characteristics of this embodiment are the same as those of the first embodiment except for the optoelectrical detecting chamber 23 and the insulator-forming chamber 24.

The apparatus of this invention for repairing organic electroluminescent element defects can repair defects with substantial short circuit portions in the organic electroluminescent element such that the pixels, which cannot be driven owing to the substantial short circuit portions, may have the same light-emitting abilities (e.g., efficiency, brightness, color purity, and the like) as those of its adjacent pixels without defects. Compared to the prior art, the apparatus solves the problems of current leakage, power consumption, and poor quality caused by substantial short circuit portions. Furthermore, since the short circuit portions are detected and repaired before the encapsulating process, it is unnecessary to spend the manufacturing cost wasted in the prior art when substantial short circuit portions are found after the encapsulating process and the panel manufacture with the organic electroluminescent elements has to be eliminated. Thus, the manufacturing cost can be decreased and the product yield and reliability can be further enhanced.

While the invention has been described by way of examples and in terms of preferred embodiments, it is to be understood that the invention is not limited to the disclosed embodiments. To the contrary, it is intended to cover various modifications. Therefore, the scope of the appended claims should be accorded the broadest interpretation so as to encompass all such modifications.

What is claimed is:

1. An apparatus for repairing an organic electroluminescent element defect, which is used to repair the electroluminescent element having a substantial short circuit portion, the apparatus comprising:
    a transfer chamber, in which the organic electroluminescent element is transferred;
    an electrical testing chamber equipped with a power supply source, the power supply source applying a current or voltage to the organic electroluminescent element so as to turn the substantial short circuit portion of the organic electroluminescent element to an open circuit portion; and
    an insulator-forming chamber, in which an insulator is formed on the open circuit portion of the organic electroluminescent element.

2. The apparatus according to claim 1, wherein the organic electroluminescent element comprises a substrate, an anode, an organic functional layer and a cathode, and the anode and the cathode are electrically connected to the power supply source, respectively.

3. The apparatus according to claim 2, further comprising:
    a light-cured adhesive dispensing chamber, in which a light-cured adhesive is dispensed on the substrate according to a predetermined pattern.

4. The apparatus according to claim 3, further comprising:
    an encapsulation chamber, in which a cover-cap is provided on the substrate dispensed with the light-cured adhesive.

5. The apparatus according to claim 3, further comprising:
    a light-exposure chamber, in which the light-cured adhesive is exposed with ultra-violet light.

6. The apparatus according to claim 2, wherein the cathode is oxidized in the insulator-forming chamber, and the insulator-forming chamber provided an atmosphere containing oxygen and being moisture-free.

7. The apparatus according to claim 2, wherein the insulator is made of the same material of the organic functional layer.

8. The apparatus according to claim 1, wherein the insulator is made of an inorganic or organic material with high resistance.

9. The apparatus according to claim 1, wherein the insulator is made of a polymer material with high resistance.

10. An apparatus for repairing an organic electroluminescent element defect, which is used to repair the electroluminescent element having a substantial short circuit portion, the apparatus comprising:

a transfer chamber, in which the organic electroluminescent element is transferred;

an electrical testing chamber equipped with a power supply source, the power supply source applying a current or voltage to the organic electroluminescent element so as to turn the substantial short circuit portion of the organic electroluminescent element to an open circuit portion;

an optoelectrical detecting chamber, in which intensity, uniformity, color purity of brightness and a short-circuited level of the organic electroluminescent element tested in the electrical testing chamber are detected; and an insulator-forming chamber, in which an insulator is formed on the open circuit portion when the short-circuited level detected in the optoelectrical detecting chamber is smaller than a predetermined level.

11. The apparatus according to claim 10, wherein the organic electroluminescent element comprises a substrate, an anode, an organic functional layer and a cathode, and the anode and the cathode are electrically connected to the power supply source, respectively.

12. The apparatus according to claim 11, further comprising:

a light-cured adhesive dispensing chamber, in which a light-cured adhesive is dispensed on the substrate according to a predetermined pattern.

13. The apparatus according to claim 12, further comprising:

an encapsulation chamber, in which a cover-cap is provided on the substrate dispensed with the light-cured adhesive.

14. The apparatus according to claim 12, further comprising:

a light-exposure chamber, in which the light-cured adhesive is exposed with ultra-violet light.

15. The apparatus according to claim 10, wherein the short-circuited level is a ratio of the amount of the short circuit portion to the amount of the open circuit portion.

16. The apparatus according to claim 10, wherein the short-circuited level is a leakage current level.

17. The apparatus according to claim 11, wherein the cathode is oxidized in the insulator-forming chamber, and the insulator-forming chamber provided an atmosphere containing oxygen and being moisture-free.

18. The apparatus according to claim 11, wherein the insulator is made of the same material of the organic functional layer.

19. The apparatus according to claim 10, wherein the insulator is made of an inorganic or organic material with high resistance.

20. The apparatus according to claim 10, wherein the insulator is made of a polymer material with high resistance.

* * * * *